United States Patent
Li et al.

(10) Patent No.: US 8,012,307 B2
(45) Date of Patent: Sep. 6, 2011

(54) SEPARATING DEVICE AND METHOD THEREOF

(75) Inventors: Yuan-Hsin Li, Jhonhli (TW); Chiu-Feng Yang, Hukou Township, Hsinchu County (TW)

(73) Assignee: Asia IC Mic-Process, Inc., Hsinchu (TW)

( * ) Notice: Subject to any disclaimer, the term of this patent is extended or adjusted under 35 U.S.C. 154(b) by 0 days.

(21) Appl. No.: 12/539,811

(22) Filed: Aug. 12, 2009

(65) Prior Publication Data

US 2010/0084093 A1 Apr. 8, 2010

(30) Foreign Application Priority Data

Oct. 7, 2008 (TW) ................................ 97138594 A

(51) Int. Cl.
*B32B 38/10* (2006.01)
(52) U.S. Cl. ........ 156/718; 156/703; 156/756; 156/763; 156/930
(58) Field of Classification Search .................. 156/584, 156/344, 703, 718, 756, 763, 930
See application file for complete search history.

(56) References Cited

U.S. PATENT DOCUMENTS

| | | | | |
|---|---|---|---|---|
| 5,240,546 A | * | 8/1993 | Shiga | 156/378 |
| 5,328,547 A | * | 7/1994 | Boldrini et al. | 156/584 |
| 5,432,318 A | * | 7/1995 | Minahan | 219/385 |
| 5,897,743 A | * | 4/1999 | Fujimoto et al. | 156/584 |
| 6,029,730 A | * | 2/2000 | Gospe et al. | 156/584 |
| 6,156,150 A | * | 12/2000 | Nishida | 156/344 |
| 6,685,795 B1 | * | 2/2004 | Braun | 156/344 |
| 6,843,298 B1 | * | 1/2005 | Borg et al. | 156/584 |
| 6,998,329 B2 | * | 2/2006 | Aga et al. | 438/458 |
| 2005/0236114 A1 | * | 10/2005 | Yanagita et al. | 156/584 |
| 2007/0122926 A1 | * | 5/2007 | Martinez et al. | 438/34 |
| 2007/0277934 A1 | * | 12/2007 | Kawashima et al. | 156/584 |

* cited by examiner

*Primary Examiner* — Mark A Osele
*Assistant Examiner* — Nickolas Harm
(74) *Attorney, Agent, or Firm* — Ming Chow; Sinorica, LLC

(57) ABSTRACT

A separating device for separating an electronic main body from a substrate bonded thereto comprises a platform, a conveying section, a dissolving section, a cleaning section, and a first partition plate. The conveying section is disposed on the platform for moving the electronic main body and the substrate forward. The dissolving section is disposed on the platform for spraying a solvent onto the bonded electronic main body and substrate. The cleaning section is also disposed on the platform for cleaning the electronic main body. The first partition plate is located between the dissolving section and the cleaning section and has at least one first slot, which allows only the electronic main body but not the substrate to pass therethrough, so that the electronic main body is separated from the substrate at the first partition plate. A method for separating the electronic main body and the substrate is also provided.

8 Claims, 9 Drawing Sheets

SEPARATING DEVICE AND METHOD THEREOF

FIELD OF THE INVENTION

The present invention relates to a separating device and method thereof, and more particularly to an automated separating device and method, with which an electronic main body can be automatically separated from a substrate bonded thereto and collected while being horizontally moved forward on the machine.

BACKGROUND OF THE INVENTION

Conventionally, to clean an electronic main body, such as a semiconductor wafer, a solar cell, or a panel, the electronic main body is transferred using a robot to a cleaning section. After that, the electronic main body is further transferred by a robot to a drying section to dry any liquid remained on the electronic main body. After being dried, the electronic main body is then transferred to a storage section for storing by a robot.

In the above-described conventional manner of cleaning an electronic main body, a series of procedures from preparing, cleaning, drying to storing are independently performed without being integrated. As a result, the cleaning operation is not continuous, which leads to waste of time and increased equipment and maintenance costs. Moreover, in the conventional cleaning operation, only one single wafer is processed in each procedure. That is, the conventional cleaning operation fails to clean a whole batch of electronic main bodies in a mass-production manner, and therefore has relatively low efficiency.

On the other hand, it is a trend to develop a thinner and thinner electronic main body. In order to avoid damage to the extremely thin electronic main body, it is necessary to additionally bond a substrate to the electronic main body for safely transporting and handling the electronic main body. The currently available cleaning devices for cleaning electronic main bodies do not comprise any devices for separating the electronic main body from the substrate bonded thereto.

It is therefore tried by the inventor to develop an improved separating device and method to overcome the problems of the aforementioned manner for cleaning the electronic main body.

SUMMARY OF THE INVENTION

One primary object of the present invention is to provide a separating device and method, with which a large quantity of electronic main bodies each having a substrate bonded thereto can be automatically separated from the substrates by a platform comprising a dissolving section, a cleaning section, a drying section and a collecting section.

Another object of the present invention is to provide a separating device, with which an electronic main body can be automatically separated from a substrate bonded thereto by a slot provided on a partition plate for separating a dissolving section and a cleaning section.

To achieve the above and other objects, the present invention is to provide a separating device for separating an electronic main body from a substrate bonded thereto, the separating device comprises a platform, on which a conveying section, a dissolving section, a cleaning section, and a first partition plate are provided. The conveying section is disposed on the platform for moving the bonded electronic main body and the substrate. The dissolving section is disposed on the platform for spraying a solvent onto the bonded electronic main body and substrate. The cleaning section is also disposed on the platform for cleaning the electronic main body. The first partition plate is located between the dissolving section and the cleaning section, and is provided with at least one first slot, which allows only the electronic main body but not the substrate to pass through, so that the electronic main body is separated from the substrate at the first partition plate.

Furthermore, the present invention is further provided a separating method for separating an electronic main body from a substrate bonded thereto, comprising following steps:
(i) providing a platform comprising a conveying section, a dissolving section, a pushing-substrate section, a cleaning section, and a first partition plate disposed thereon, and the first partition plate being located between the dissolving section and the cleaning section;
(ii) moving the electronic main body and the substrate bonded thereto using the conveying section toward the first partition plate;
(iii) spraying a solvent from the dissolving section to dissolve an adhesive applied on the electronic main body;
(iv) passing the electronic main body through the cleaning section using the first slot provided on the first partition plate, while making the substrate stopped by the first slot, so that the electronic main body is separated from the substrate at the first partition plate;
(v) guiding the separated substrate by the pushing-substrate section to pass through a second slot provided on the first partition plate into the cleaning section; and
(vi) using deionized water, isopropyl alcohol (IPA) or a chemical cleaning agent spraying from the cleaning section to clean the separated electronic main body and substrate and remove the dissolved adhesive from the electronic main body and the substrate.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
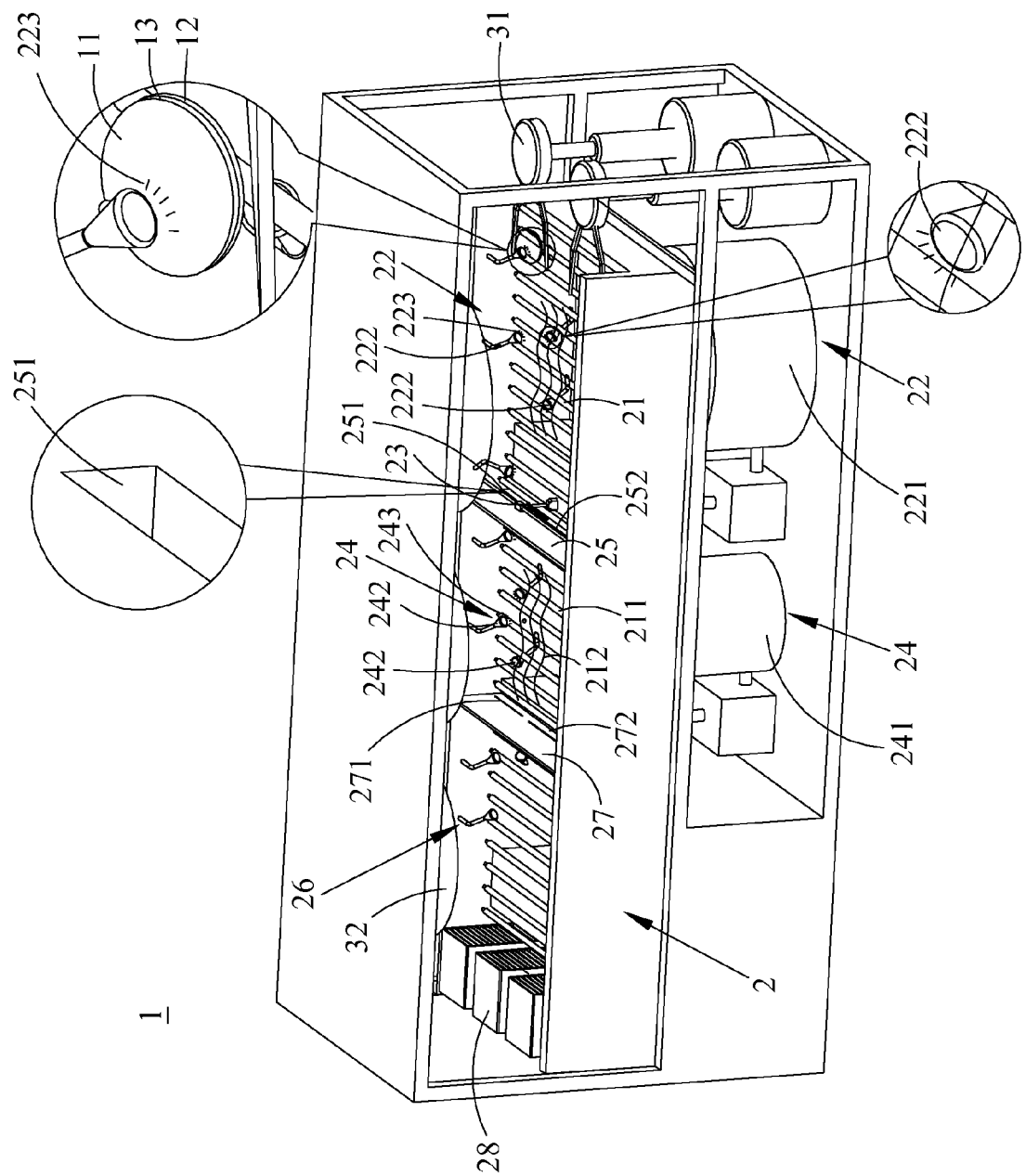
FIG. 1 is a perspective view of a separating device according to a preferred embodiment of the present invention.
Figure 2:
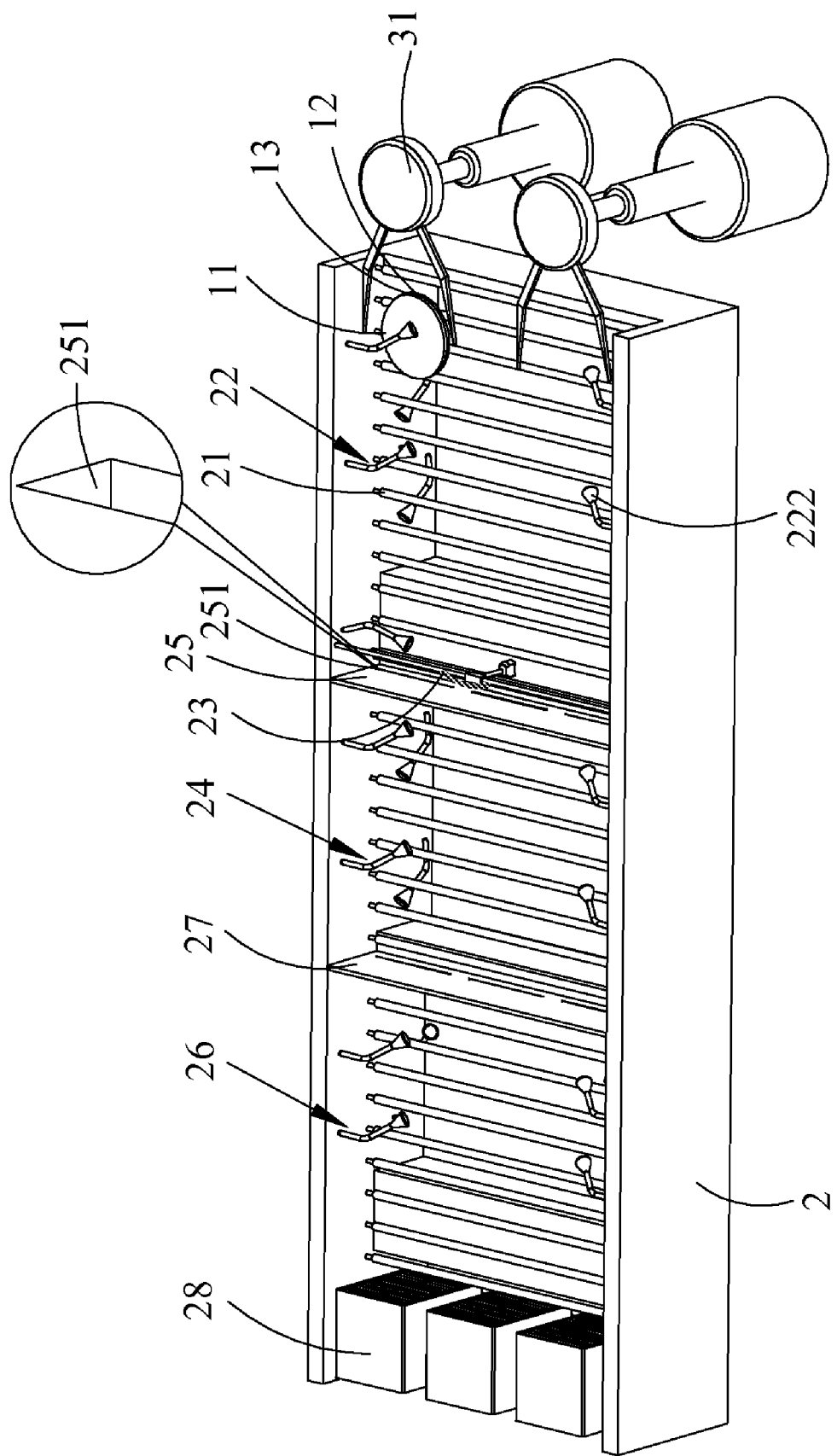
FIG. 2 shows a first operating schematic view of a separating device according to the present invention.
Figure 3:
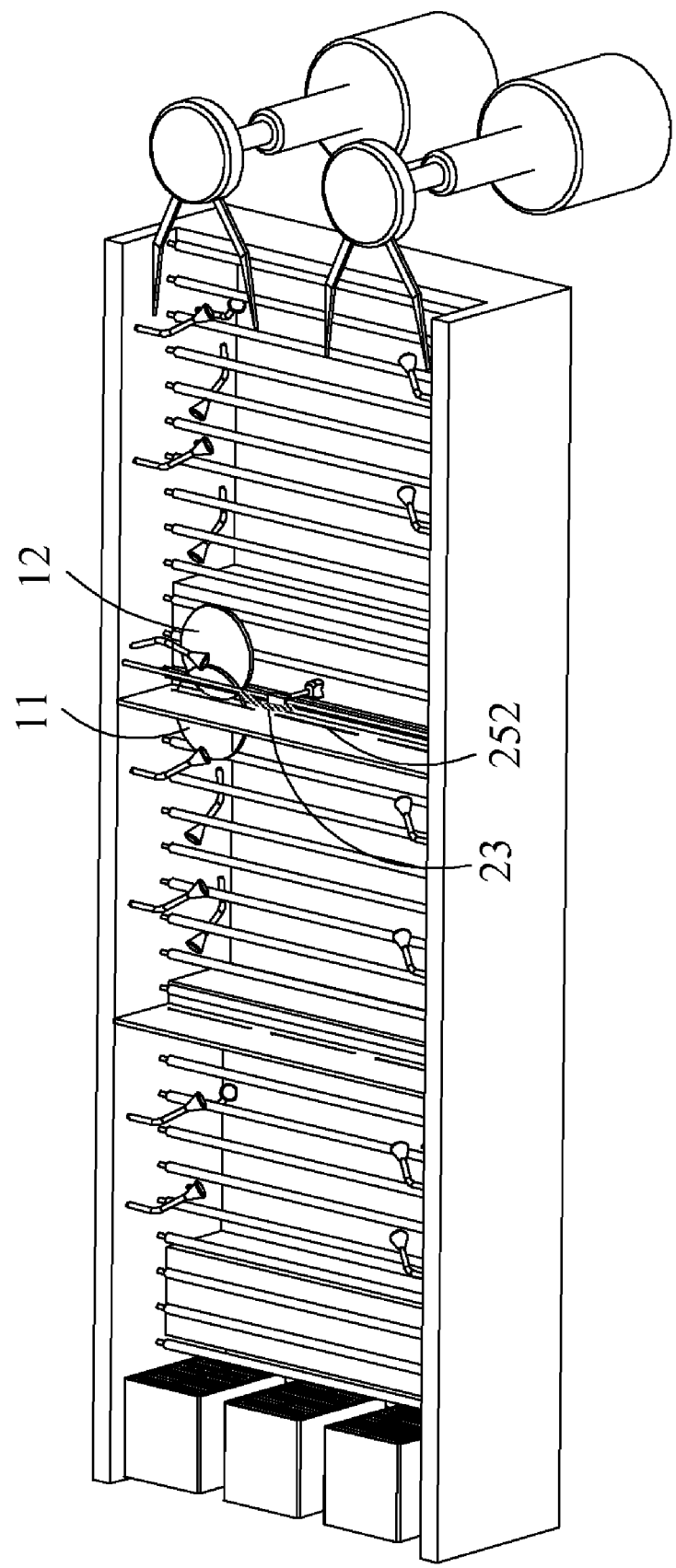
FIG. 3 shows a second operating schematic view of the separating device according to the present invention.
Figure 4:
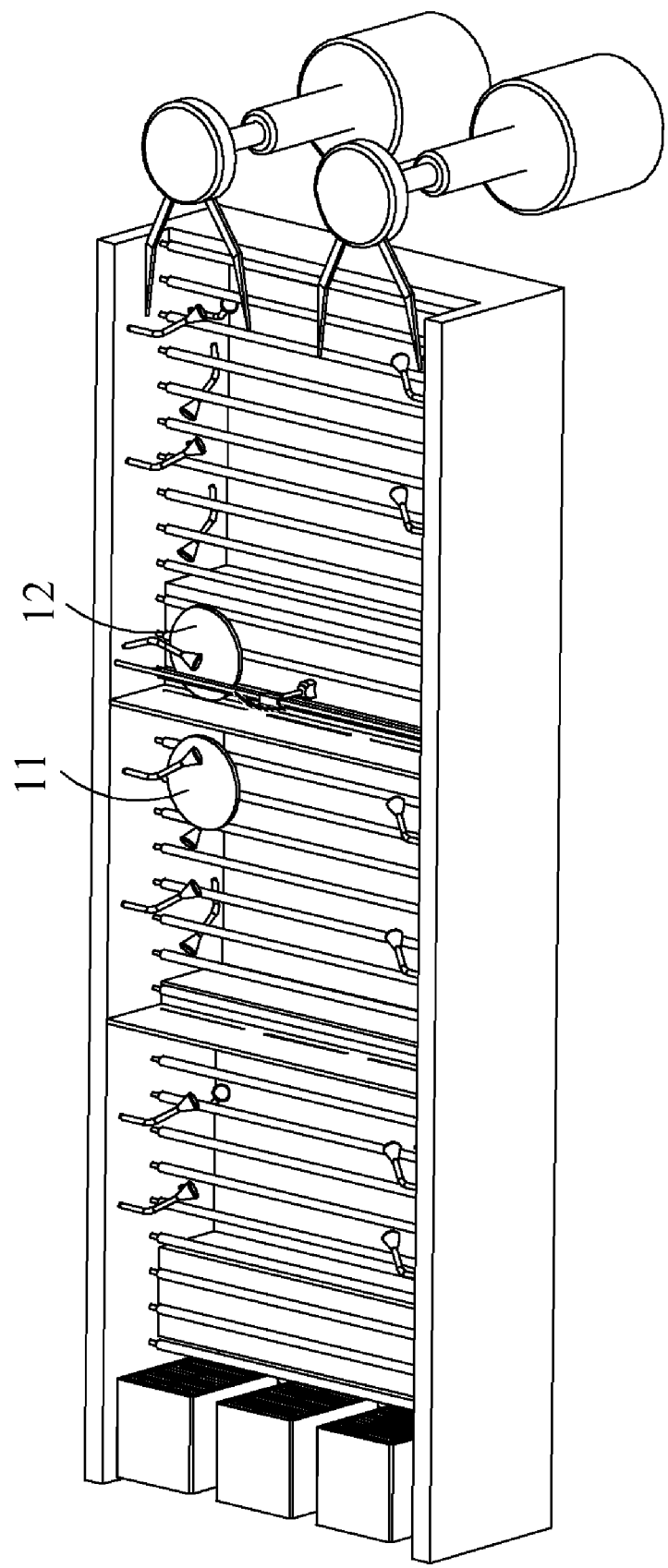
FIG. 4 shows a third operating schematic view of the separating device according to the present invention.
Figure 5:
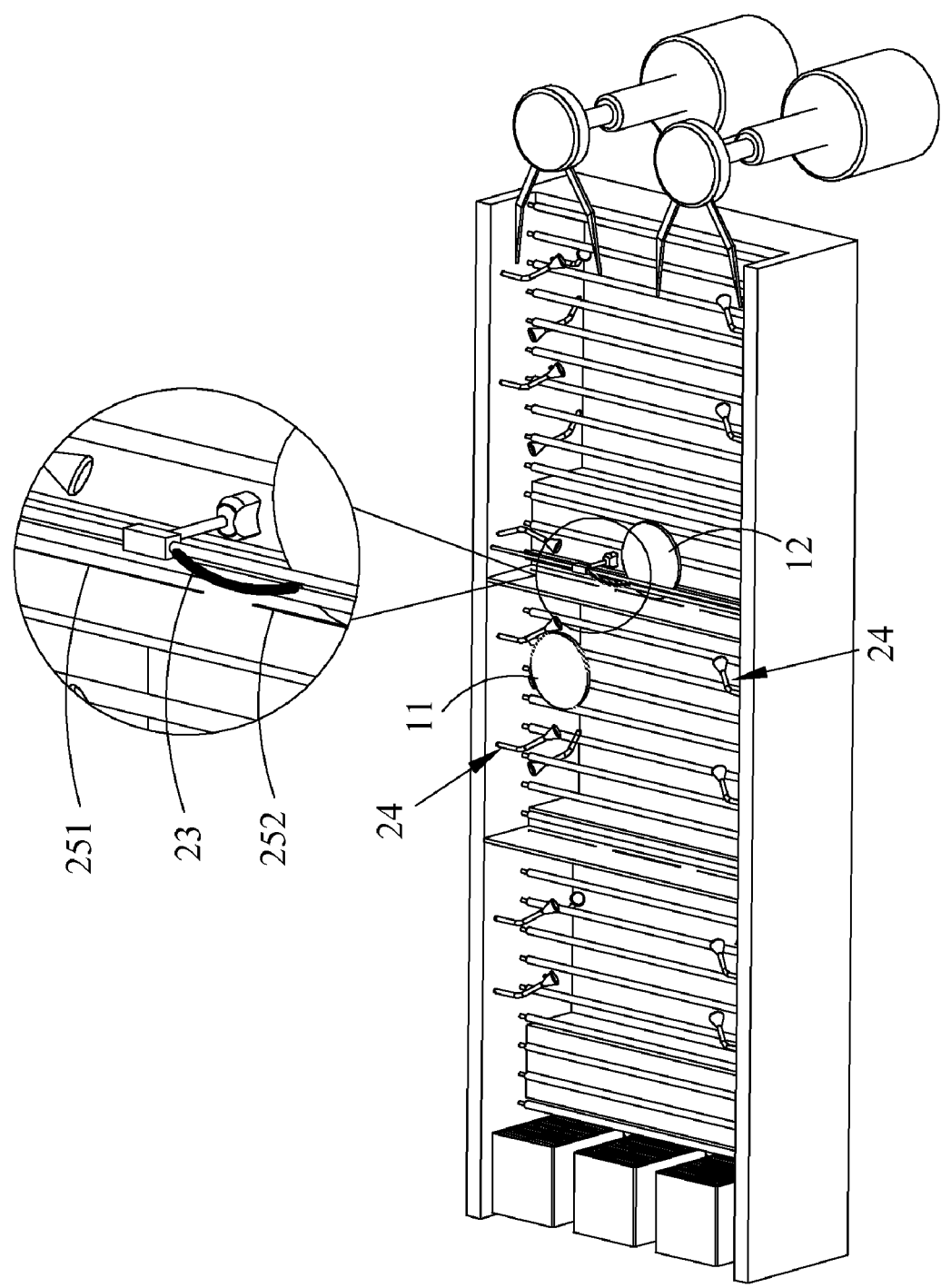
FIG. 5 shows a fourth operating schematic view of the separating device according to the present invention.
Figure 6:
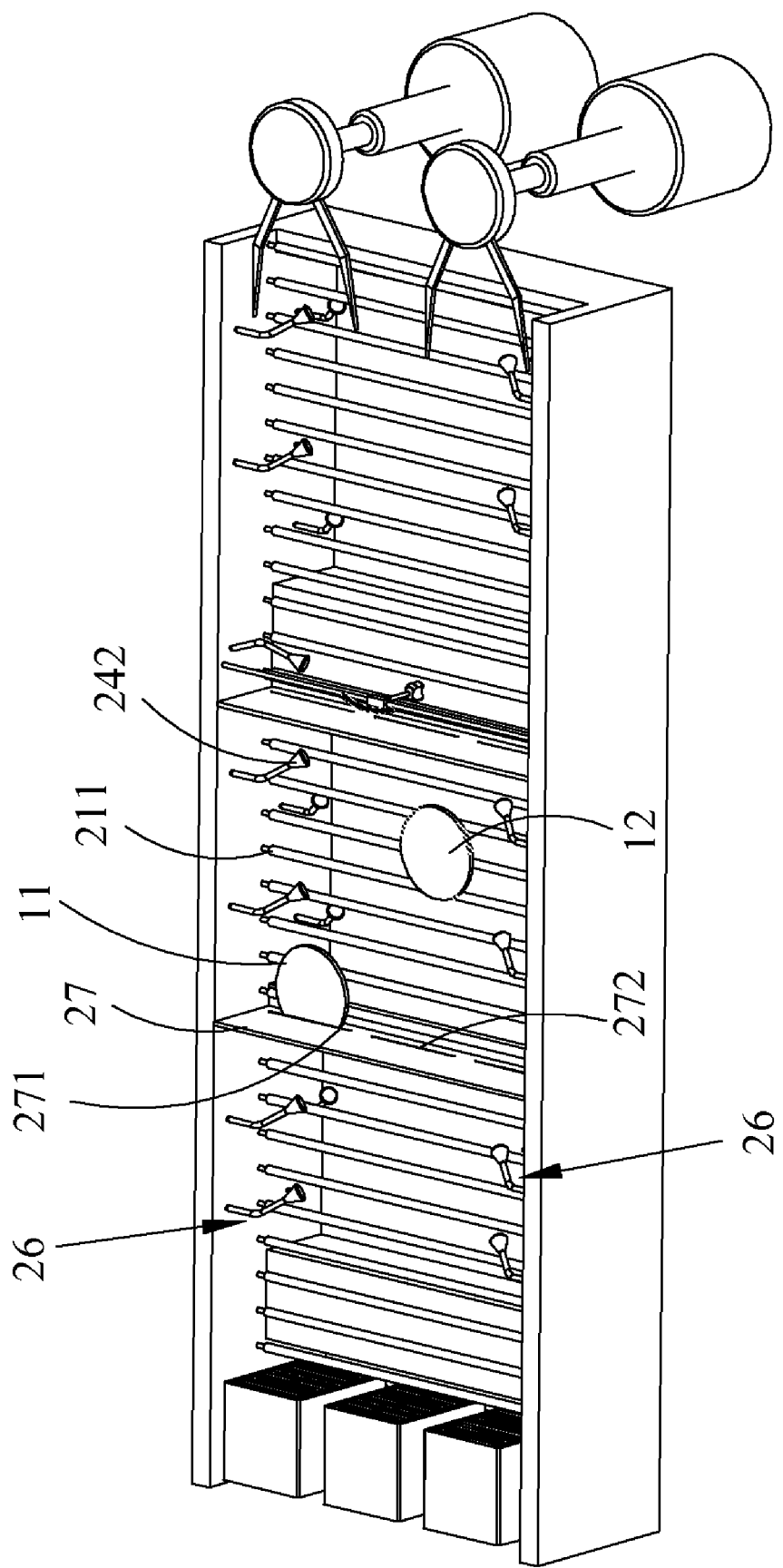
FIG. 6 shows a fifth operating schematic view of the separating device according to the present invention.
Figure 7:
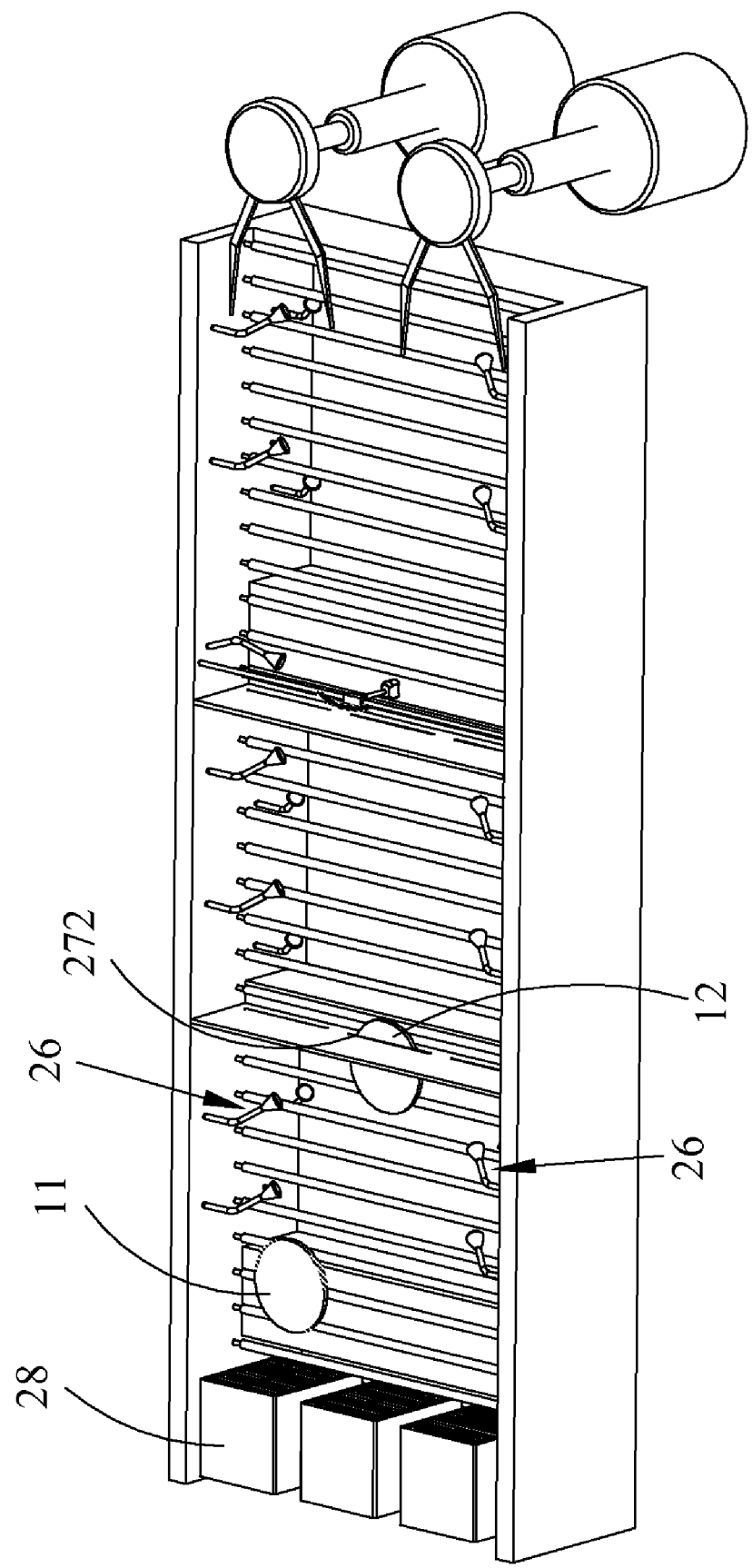
FIG. 7 shows a sixth operating schematic view of the separating device according to the present invention.
Figure 8:
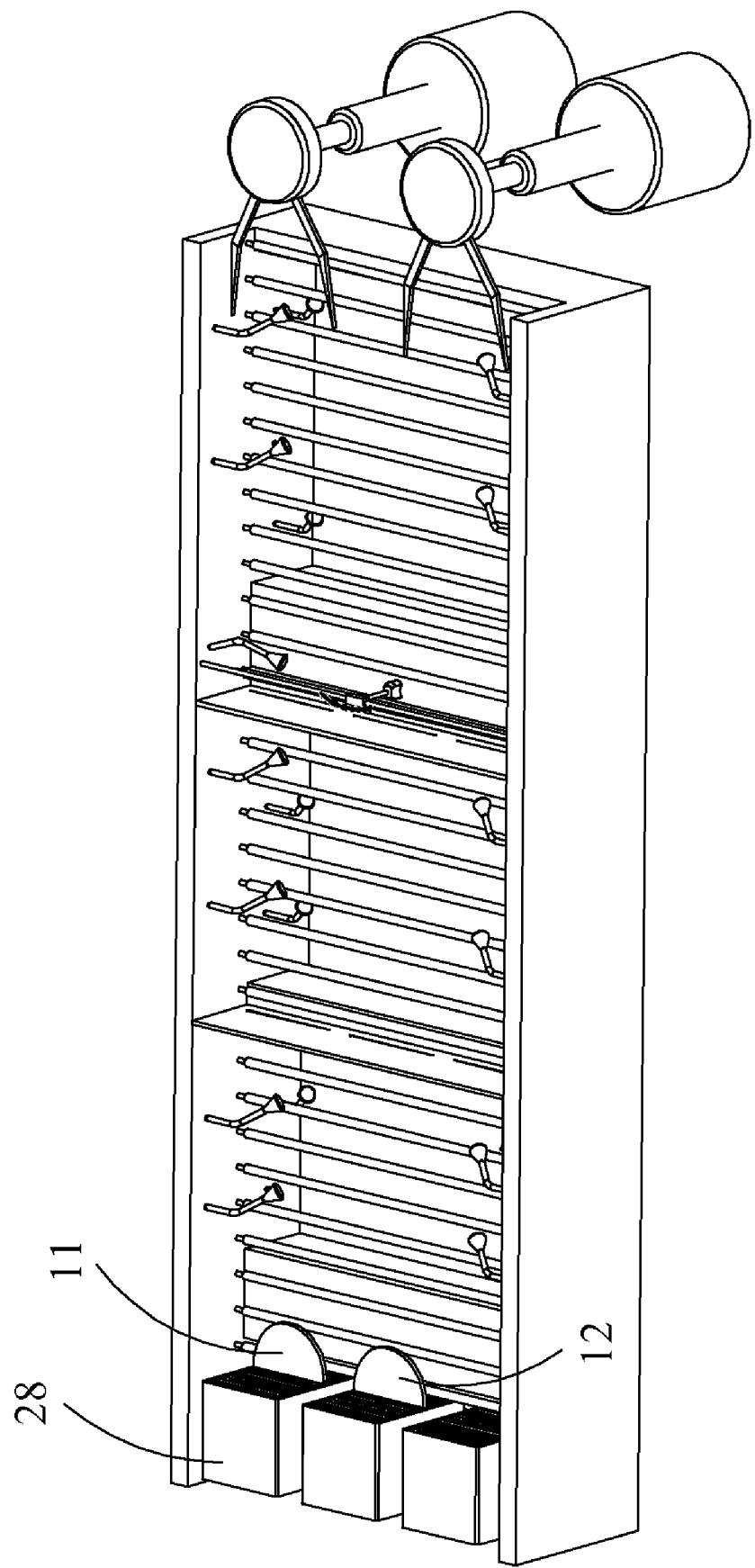
FIG. 8 shows a seventh operating schematic view of the separating device according to the present invention.

Please refer to FIG. 1, which is a perspective view of a separating device 1 according to a preferred embodiment of the present invention. The separating device 1 is used to separate an electronic main body 11 from a substrate 12 bonded thereto. The electronic main body 11 can be a wafer, a solar cell, a panel, or any other electronic component separably bonded to a substrate. In the illustrated embodiment, the electronic main body 11 is, but is not limited to, a wafer. The separating device 1 comprises a platform 2, a conveying section 21, a dissolving section 22, a pushing-substrate section 23, a cleaning section 24, a first partition plate 25, a drying section 26, a second partition 27, and a collecting section 28. The conveying section 21 is disposed on the platform 2 and comprises a roller assembly 211 and a fluid stream 212 supplied onto the platform 2, so as to move the electronic main body 11 and the substrate 12 forward. The roller assembly 211 is located in the dissolving section 22, the cleaning section 24, and the drying section 26. The fluid stream 212 is supplied onto the dissolving section 22 and the cleaning section 24 on the platform 2. In the event that the supplied fluid stream 212 does not submerge the bonded electronic main body 11 and substrate 12, the roller assembly 211 can cooperate with the first nozzles 222 and the second nozzles 242 provided two ends of the roller assembly 211 to drive the electronic main body 11 and the substrate 12 forward. On the other hand, when the fluid stream 212 submerges the bonded electronic main body 11 and substrate 12, the fluid stream 212 can also be used along with the roller assembly 211 to drive the electronic main body 11 and the substrate 12 forward in addition to the roller assembly 211. In the illustrated embodiment, the roller assembly 211 and the fluid stream 212 are used simultaneously to drive the electronic main body 11 and the substrate 12 forward. However, it can be understood that the electronic main body 11 and the substrate 12 are not necessarily driven forward using the roller assembly 211 and the fluid stream 212 at the same time.

The dissolving section 22 is disposed on the platform 2 and comprises a solvent supply device 221 and a plurality of first nozzles 222. A type of solvent 223 is supplied from the solvent supply unit 221 to the first nozzles 222, so that the solvent 223 is sprayed onto the bonded electronic main body 11 and substrate 12 to dissolve an adhesive 13 that bonds the electronic main body 11 to the substrate 12. The solvent 223 is obliquely sprayed from the first nozzles 222 onto the bonded electronic main body 11 and the substrate 12, so as to move the bonded electronic main body 11 and substrate 12 forward. The pushing-substrate section 23 is located in front of the first partition plate 25 for guiding the substrate 12, which has already separated from the electronic main body 11, to a second slot 252 provided on the first partition plate 25. The cleaning section 24 is disposed on the platform 2, and comprises a cleaning agent supply device 241 and a plurality of second nozzles 242 for cleaning the electronic main body 11 and the substrate 12 to remove the dissolved adhesive 13 therefrom.

The first partition plate 25 is disposed between the dissolving section 22 and the cleaning section 24, and is provided with at least one first slot 251 and at least one second slot 252. The first slot 251 is provided for only the electronic main body 11 passing therethrough, while the second slot 252 is provided for the substrate 12 to pass therethrough. The conveying section 21 together with the obliquely sprayed solvent 223 drives the electronic main body 11 and the substrate 12 forward since the adhesive 13 between the electronic main body 11 and the substrate 12 is dissolved by the solvent 223. When reaching at the first partition plate 25, the substrate 12 is stopped by the first partition plate 25 from moving forward while the electronic main body 11 passes through the first slot 251 and keeps moving forward. As a result, the electronic main body 11 is fully separated from the substrate 12 while it is moving, and is further moved toward the drying section 26. The position and height of the first slot 251 and the second slot 252 may be determined according to the thickness of the electronic main body 11 and of the substrate 12.

The drying section 26 serves to dry the separated electronic main body 11 and substrate 12. The second partition 27 is disposed between the cleaning section 24 and the drying section 26, and is provided with a third slot 271 and a fourth slot 272. A cleaning agent 243 supplied from the cleaning agent supply device 241 is supplied to the second nozzles 242, so that the cleaning agent 243 is sprayed onto the separated electronic main body 11 and substrate 12 to wash off the adhesive 13 dissolved between the electronic main body 11 and the substrate 12. The cleaning agent 243 may comprise deionized water, isopropyl alcohol (IPA) or other chemicals. The second nozzle 242 is obliquely sprayed onto the electronic main body 11 and the substrate 12. The collecting section 28 is used to collect the cleaned electronic main body 11 and substrate 12 respectively.

The separating device 1 of the present invention can further comprise a clamping section 31 and an exhausting system 32 according to the actual need. The clamping section 31 is used to clamp and position the bonded electronic main body 11 and substrate 12 onto the platform 2. The exhausting system 32 is provided above the platform 2 for sucking and then exhausting chemical gases produced in a series of procedures performed on the separating device 1.

Figure 9:
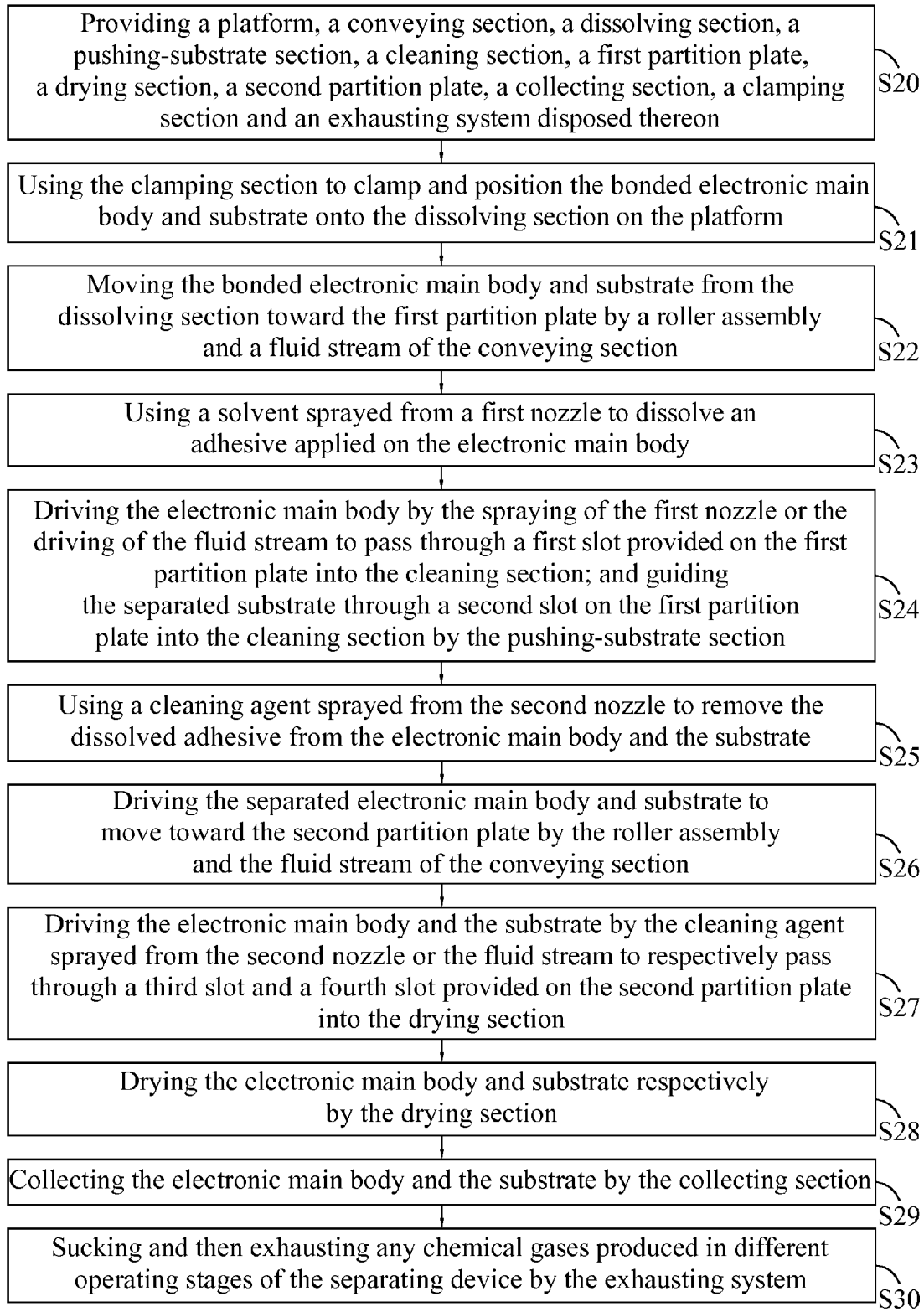
FIG. 9 is a flowchart showing the steps comprised in a separating method according to a preferred embodiment of the present invention.

FIGS. 2 to 8 show different operating stages on the separating device of the present invention, and FIG. 9 is a flowchart showing the steps comprised in a method of the present invention for separating an electronic main body 11 from a substrate 12 bonded thereto. In a preferred embodiment of the present invention, the electronic main body 11 is a wafer. However, it is understood that the electronic main body 11 is not limited to a wafer, but can be otherwise a solar cell, a panel, or any other electronic element separably bonded to a substrate 12.

Please refer to FIG. 9 along with FIGS. 1 to 8. The separating method of the present invention comprises the following steps:

In step S20, a platform 2, a conveying section 21, a dissolving section 22, a pushing-substrate section 23, a cleaning section 24, a first partition plate 25, a drying section 26, a second partition plate 27, and a collecting section 28, as well as an optional clamping section 31 and an optional exhausting system 32 disposed thereon as shown in FIG. 1 is provided;

In step S21, the clamping section 31 clamps and positions the bonded electronic main body 11 and substrate 12 onto the dissolving section 22 on the platform 2;

In step S22, a roller assembly 211 and a fluid stream 212 of the conveying section 21 together move the bonded electronic main body 11 and substrate 12 from the dissolving section 22 toward the first partition plate 25, as may be seen in FIG. 1;

In step S23, a type of solvent, such as alcohol, IPA, or other suitable chemical solvents, is sprayed via a first nozzle 222 to dissolve an adhesive 13 applied on the wafer;

In step S24, the electronic main body 11 is driven by the spraying of the first nozzles 222 or the driving of the fluid stream 212 to move through a first slot 251 on the first partition plate 25 into the cleaning section 24, meanwhile, the substrate 12 is stopped by the first partition plate 25 from passing through the first slot 251, and is therefore fully separated from the electronic main body 11; at this point, the pushing-substrate section 23 guides the separated substrate 12 passing through a second slot 252 provided on the first partition plate 25 into the cleaning section 24;

In step S25, a cleaning agent is sprayed from a second nozzle 242 onto the electronic main body 11 and the substrate 12 to remove the dissolved adhesive (not shown) from the electronic main body 11 and the substrate 12;

In step S26, the roller assembly 211 and the fluid stream 212 of the conveying section 21 drive the separated electronic main body 11 and substrate 12 to move from the cleaning section 24 toward the second partition 27;

In step S27, the electronic main body 11 and the substrate 12 are driven by the spraying of the second nozzles 242 or the driving of the fluid stream 212 to move through a third slot 271 and a fourth slot 272 provided on the second partition 27 respectively to the drying section 26;

In step S28, the separated electronic main body 11 and substrate 12 are dried by the drying section 26 while being moved by the roller assembly 211 of the conveying section 21 toward the collecting section 28;

In step S29, the electronic main body 11 and the substrate 12 are collected at the collecting section 28; and In step S30, the exhausting system 32 as shown in FIG. 1 sucks and then exhausts any chemical gases produced in different operational stages on the platform 2 to complete a series of procedures for separating the electronic main body 11 from the substrate 12.

In the present invention, since the conveying section 21, the dissolving section 22, the pushing-substrate section 23, the cleaning section 24, the first partition plate 25, the drying section 26, the second partition 27, and the collecting section 28 are all disposed on the platform 2, a series of consistent and automated operational procedures for separating the electronic main body 11 from the substrate 12 and collecting them can be completed while the electronic main body 11 and the substrate 12 are horizontally moved on the platform 2. Moreover, the separated electronic main body 11 and substrate 12 can also be synchronously processed to thereby enable largely increased productivity and reduced the cost for the apparatus needed to separate the bonded electronic main body and substrate.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A method for separating an electronic main body from a substrate bonded thereto, comprising the following steps:
   providing a platform, a conveying section, a dissolving section, a pushing-substrate section, a cleaning section and a first partition plate; and the first partition plate being located between the dissolving section and the cleaning section;
   moving the electronic main body bonded to the substrate toward the first partition plate using the conveying section;
   spraying a solvent from the dissolving section to dissolve an adhesive applied on the electronic main body;
   passing the electronic main body through a first slot provided on the first partition plate into the cleaning section, while the substrate is stopped by the first partition plate, so that the substrate is separated from the electronic main body;
   passing the substrate separated from the electronic main body through a second slot provided on the first partition plate into the cleaning section using the pushing-substrate section; and
   cleaning the electronic main body separated from the substrate and the substrate using a cleaning agent sprayed from the cleaning section to move the adhesive dissolved by the solvent from the electronic main body and the substrate.

2. The separating method as claimed in claim 1, further comprising a step in which the cleaning agent sprayed from the cleaning section drives the electronic main body and the substrate to pass through a third slot and a fourth slot, respectively, provided on a second partition plate into a drying section.

3. The separating method as claimed in claim 1, further comprising a step of disposing a drying section on the platform to dry respectively the separated electronic main body and substrate.

4. The separating method as claimed in claim 1, further comprising a step of disposing a collecting section on the platform to collect the separated electronic main body and substrate.

5. The separating method as claimed in claim 1, wherein the dissolving section comprises a first nozzle, via which the solvent is sprayed to dissolve the adhesive applied between the electronic main body and the substrate.

6. The separating method as claimed in claim 1, wherein the cleaning section comprises a second nozzle, via which a type of cleaning agent is sprayed to drive one of the electronic main body and the substrate forward.

7. The separating method as claimed in claim 1, wherein the conveying section comprises a roller assembly or a fluid stream for moving one of the electronic main body and the substrate.

8. The separating method as claimed in claim 1, wherein the electronic main body is selected from the group consisting of a wafer, a solar cell and a panel.

* * * * *